United States Patent [19]

Bardin

[11] 4,003,311
[45] Jan. 18, 1977

[54] GRAVURE PRINTING METHOD

[76] Inventor: Karl D. Bardin, 100 Water St., Guilford, Conn. 05437

[22] Filed: Aug. 13, 1975

[21] Appl. No.: 604,221

[52] U.S. Cl. .............................. 101/426; 101/211; 101/401.1; 96/30; 35/28.3; 101/34

[51] Int. Cl.$^2$ ...................... G03F 1/00; B41C 1/02

[58] Field of Search .............. 101/401.1, 426, 170, 101/211, 395, 34; 96/27 R, 30, 37, 43; 33/1 B, 1 C, 274; 35/28.3; 156/14

[56] References Cited

UNITED STATES PATENTS

| | | | |
|---|---|---|---|
| 1,703,449 | 2/1929 | Huebner | 96/30 |
| 1,872,943 | 8/1932 | Harvey | 101/211 X |
| 2,641,853 | 6/1953 | Helding | 35/28.3 |
| 2,691,586 | 10/1954 | Yule et al. | 101/401.1 X |
| 2,891,323 | 6/1959 | Eckstein et al. | 35/28.3 |
| 3,288,059 | 11/1966 | Atkinson | 101/426 X |
| 3,393,618 | 7/1968 | Baker | 95/1 |
| 3,434,227 | 3/1969 | Brown, Jr. | 35/28.3 |
| 3,666,479 | 5/1972 | Wiese | 101/401.1 X |
| 3,752,072 | 8/1973 | Lorber | 101/211 |

FOREIGN PATENTS OR APPLICATIONS

| | | | |
|---|---|---|---|
| 566,569 | 12/1932 | Germany | 35/28.3 |
| 477,808 | 5/1929 | Germany | 35/28.3 |
| 469,855 | 1/1937 | United Kingdom | 35/28.3 |

Primary Examiner—E. H. Eickholt
Attorney, Agent, or Firm—Guy A. Greenawalt

[57] ABSTRACT

A method of gravure printing which comprises preparing a tone chart having tone scale images with known density values and known gradations between a series of steps between a deep shadow tone density value and a light shadow tone density value, etching a test tone cylinder to reproduce the tone chart and measuring and recording the cell geometry of each tone image on the test cylinder, placing the test cylinder on the press to be used and operating the press with ink and substrate selected for the copy to be reproduced, measuring the tone densities of the printed product samples obtained during the test run and recording this data along with the data on density values of the tone chart and the cell geometry of the test cylinder, determining from this data the tone scale and press operating conditions which will produce theoretically optimum reproduction on the press, preparing specifications, in terms of cell geometry, for engraving of production cylinders and preparing production cylinders according to the cell geometry specifications including incorporating in the production cylinders tone images for shadow, middle and light tones of the selected tone scale so as to provide a tone check point for monitoring the production.

11 Claims, 6 Drawing Figures

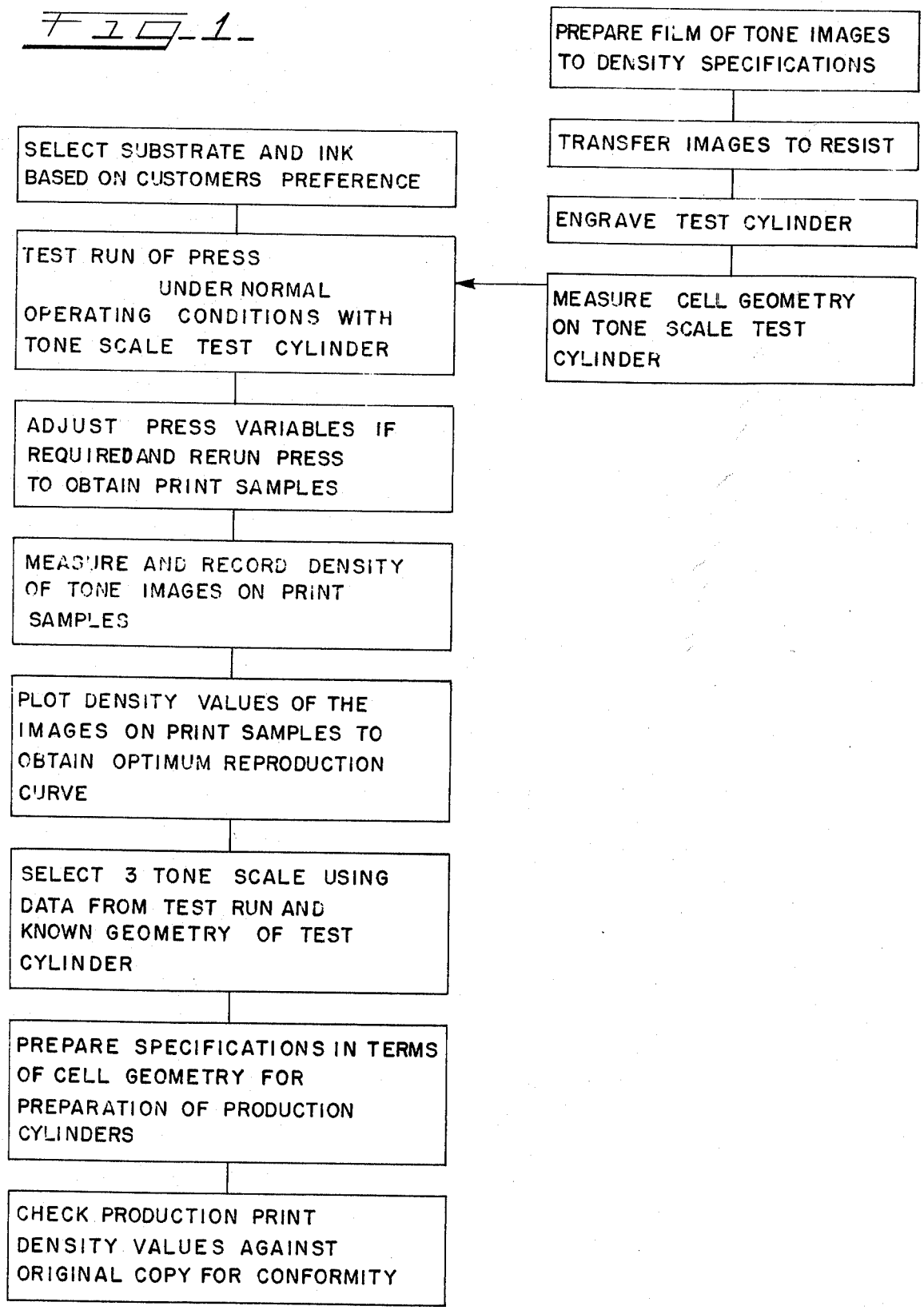

FIG. 2

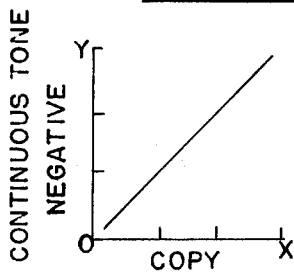

1 — GENERATION 1: CONTINUOUS TONE REPRODUCTION OF CONTINUOUS TONE COPY.

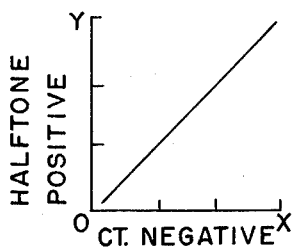

2 — GENERATION 2: HALF TONE REPRODUCTION OF CONTINUOUS TONE REPRODUCTION OF COPY.

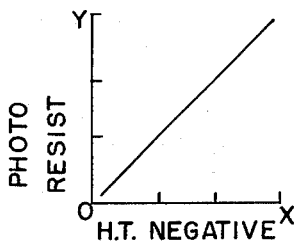

3 — GENERATION 3: PHOTO RESIST REPRODUCTION OF HALF TONE REPRODUCTION OF CONTINUOUS TONE REPRODUCTION OF COPY.

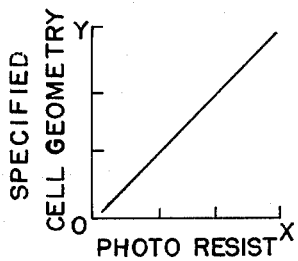

4 — GENERATION 4: ETCHED 3D REPRODUCTION OF RESIST REPRODUCTION OF HALFTONE REPRODUCTION OF CONTINUOUS TONE REPRODUCTION OF COPY.

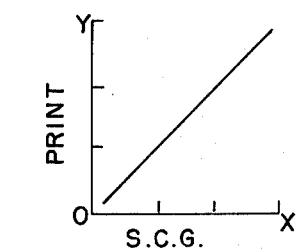

5 — GENERATION 5: PRINTED REPRODUCTION OF S.C.G. REPRODUCTION OF PHOTO RESIST REPRODUCTION OF HALFTONE REPRODUCTION OF CONTINUOUS TONE REPRODUCTION OF COPY.

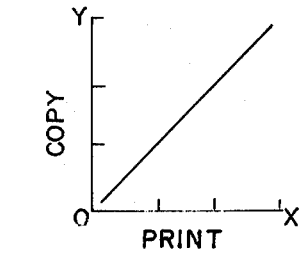

6 — OBJECT: PERFECT REPRODUCTION, CURVE OF PRINTING AND COPY IS GRAPHED EXPRESSION OF THE SUM OF THE VARIABLES.

FIG-3
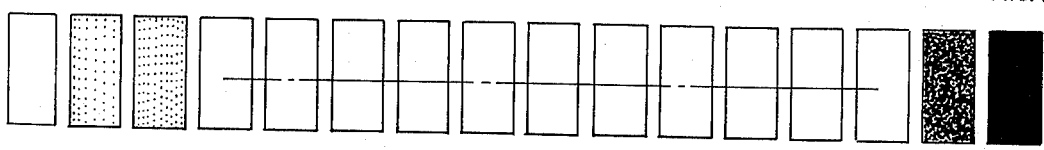
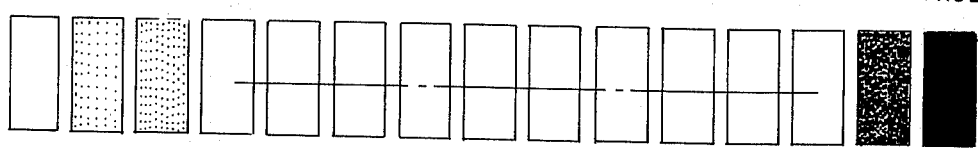
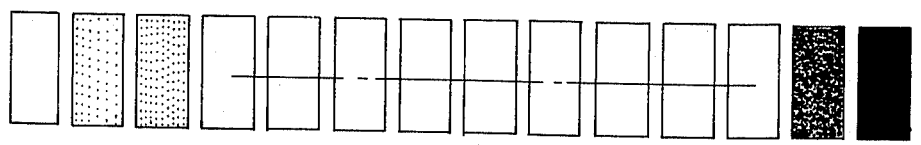
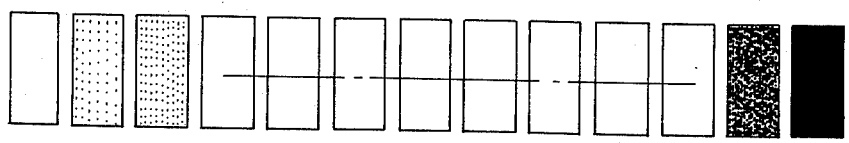
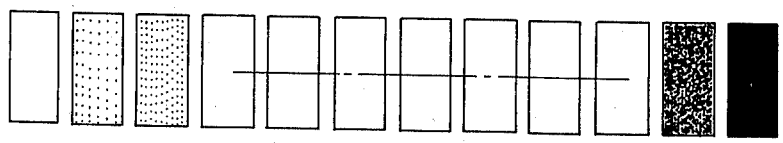

FIG. 4

| Row | ROW A1A-A16A | | | | | ROW A1B-A15B | | | | | ROW A1C-A14C | | | | | ROW A1D-A13D | | | | | ROW A1E-A12E | | | | |
|---|---|---|---|---|---|---|---|---|---|---|---|---|---|---|---|---|---|---|---|---|---|---|---|---|---|
| | FILM DENSITY | CELL DIAMETER | CELL DENSITY | PRINT DEPTH | PRINT DENSITY | FILM DENSITY | CELL DIAMETER | CELL DENSITY | PRINT DEPTH | PRINT DENSITY | FILM DENSITY | CELL DIAMETER | CELL DENSITY | PRINT DEPTH | PRINT DENSITY | FILM DENSITY | CELL DIAMETER | CELL DENSITY | PRINT DEPTH | PRINT DENSITY | FILM DENSITY | CELL DIAMETER | CELL DENSITY | PRINT DEPTH | PRINT DENSITY |
| 1 | — | 50 | 20 | 0.18 | — | — | 55 | 27 | 0.19 | — | — | 60 | 32 | 0.19 | 0.19 | — | 55 | 30 | 0.19 | 0.19 | — | 60 | 28 | 0.18 | 0.18 |
| 2 | 0.03 | | | | | 0.03 | | | | | 0.03 | | | | | 0.03 | | | | | | | | | |
| 3 | 0.05 | 65 | 20 | 0.26 | | 0.05 | | | ↑ | 0.05 | | 65 | 33 | | 0.30 | | | | | | | | | | |
| 4 | | | | | | 0.06 | | | | | 0.06 | | 75 | 31 | | 0.35 | | | | | | | | | |
| 5 | | | | | | | | | | | | | | | | 0.10 | | 90 | 33 | | 0.54 | | | | | |
| 6 | | | | | | | | | | | 0.11 | | 95 | 39 | | 0.71 | | | | | | | | | |
| 7 | | | | | | | | | ↑ | 0.13 | | 105 | 35 | | 0.93 | | | | | | | | | |
| 8 | | | | | | | | | | | 0.17 | | 113 | 38 | | 1.37 | | | | | | | | | |
| 9 | | | | | | | | | | | 0.21 | | 121 | 38 | | 1.98 | | | | | | | | | |
| 10 | | | | | | | | | | | 0.26 | | 128 | 35 | | 2.07 | | | | | | | | | |
| 11 | | | | | | | | | | | 0.27 | | 133 | 37 | | 2.19 | | | | | | | | | |
| 12 | | | | | | | | | | | 0.32 | | 137 | 38 | | 2.17 | | | | | 0.31 | 145 | 45 | 2.37 | |
| 13 | | | | | | | | | | | 0.36 | | 140 | 34 | | 2.23 | 0.37 | 143 | 40 | 2.39 | | ✕ | ✕ | ✕ | ✕ |
| 14 | | | | | | | | | ↑ | | 0.43 | | 143 | 30 | | 2.36 | | ✕ | ✕ | ✕ | ✕ | ✕ | ✕ | ✕ | ✕ |
| 15 | | | 143 | 0.56 | | | | 23 | 2.18 | | ✕ | ✕ | ✕ | ✕ | ✕ | ✕ | ✕ | ✕ | ✕ | ✕ | ✕ | ✕ | ✕ | ✕ | ✕ |
| 16 | 0.55 | 145 | 26 | 2.03 | ✕ | ✕ | ✕ | ✕ | ✕ | ✕ | ✕ | ✕ | ✕ | ✕ | ✕ | ✕ | ✕ | ✕ | ✕ | ✕ | ✕ | ✕ | ✕ | ✕ | ✕ |

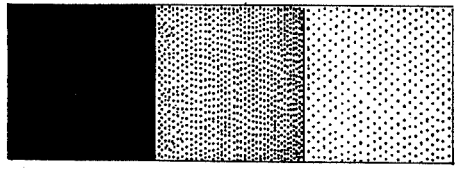

SPECIFICATION
(150 LINE SCREEN)

SHADOW TONE FILM DENSITY = 0.40 ± 0.01
DOT DIAMETER = 131 $m\mu$ ± 1 $m\mu$
DOT AREA = 17,161 $m\mu^2$ ± 260 $m\mu^2$
ETCH DIAMETER = 153 $m\mu$
ETCH DEPTH = 30 $m\mu$
ETCH AREA = 23,409 $m\mu^2$
UNIT VOLUME = 1.58 × 10$^{10}$ $m\mu^3$/IN$^2$

MIDDLE TONE FILM DENSITY = 0.12 ± 0.01
DOT DIAMETER = 83 $m\mu$ ± 3 $m\mu$
DOT AREA = 6,889 $m\mu^2$ ± 600 $m\mu^2$
ETCH DIAMETER = 107 $m\mu$
ETCH DEPTH = 30 $m\mu$
ETCH AREA = 11,449 $m\mu^2$
UNIT VOLUME = 7.74 × 10$^9$ $m\mu^3$/IN$^2$

LIGHT TONE FILM DENSITY = 0.05 ± 0.01
DOT DIAMETER = 56 $m\mu$ ± 5 $m\mu$
DOT AREA = 3136 $m\mu^2$ ± 600 $m\mu^2$
ETCH DIAMETER = 70 $m\mu$
ETCH DEPTH = 25 $m\mu$
ETCH AREA = 4900 $m\mu^2$
UNIT VOLUME = 2.75 × 10$^9$ $m\mu^3$/IN$^2$

GRAVURE PRINTING METHOD

This invention relates to photogravure printing and is more particularly concerned with improvements in methods and procedures for process or tone printing, that is, where various densities of the same color are present in the finished product, in either black and white or color, preparing gravure plates or cylinders and controlling the preparation of the plates and the cylinders in accordance with specifications or standards which are determined by the geometry of the cell structure required to obtain the desired tone values, as measured on the copy and according to the capabilities of the production press in the production of prints on predetermined stock, with a preselected ink formulation and employing a test cylinder engraved with tone scales of known cell geometry so as to enable the press to be operated for optimum reproduction with final printed products duplicating to a very high degree the original copy.

Printing procedures employing gravure plates or cylinders produced by engraving or etching are known which enable the reproduction of art material with or without accompanying type and/or line material. Some procedures, when carefully followed, result in copies of relatively high fidelity which are acceptable commercially. However, there are so many variables in the production of the recessed printing elements and in the use of the printing tools that uniform quality reproduction has been extremely difficult to attain with methods heretofore employed, particularly when the production volume requires the use of more than a single production cylinder. Also, conventional methods have involved work in the preparation and use of the printing elements which has increased costs to a point where it is not competitive, costwise, with other printing methods. A basic problem which has resisted satisfactory solution, has been the need for a procedure which can be followed with assurance that an acceptable product conforming to an original copy or an accepted proof will be obtained by following a set of specifications for the production of the printing cylinders and operation of the press.

In gravure printing of a publication or in packaging printing where graphic quality, especially in process illustrations, is of extreme importance, it is recognized that to be able to determine correct specifications for photography and etching that will produce the optimum printed quality at maximum productivity and with minimum waste would be advantageous. However, an engineered set of standards or specifications which, if followed, will produce the most desirable results under production conditions, that is, a clearly defined product, has not been made available by anyone, heretofore, either for gravure printing generally or for particular copy. It is a general object of the invention, therefore, to provide a method or system of gravure printing which comprises the determination of the capabilities of the production printing machine and the setting up of specifications to be followed in the preparation of photographic materials and the engraving of plates for use on the machine with a predetermined substrate and a predetermined printing fluid based on customer preferance so as to enable high speed production of copies of uniform quality conforming closely to the original copy.

It is a more specific object of the invention to provide a gravure printing procedure which eliminates the need to resort to hand correction or re-work of gravure plates or cylinders for production products, regardless of the number required, and which enables the production in large quantity of a printing product of high quality, with a uniformity not heretofore obtainable.

It is a further object of the invention to provide a gravure printing procedure which enables the production of proof and the matching of the same on the production press by utilizing a set of specifications for controlling the variables involved in the etching of the proof plate and the production plate or cylinder so that, without the need for hand work on the cylinders, the production product will match the copy, or a proof, where required, with the specifications being determined according to the characteristics of the copy to be reproduced, the ink and substrate selected and the variables affecting the operation of the press which is to be used so as to obtain the best quality and most uniform reproduction product within the capabilities of the press.

It is another object of the invention to provide a procedure for printing with gravure plates or cylinders wherein specifications may be set up for the production of film, proof plate, if needed, and production plates or cylinders in terms of cell geometry and resultant density which enable a proof to be made and duplicated in production through control of the preparation of film, etching of proof plate or plates and etching of one or more production plates and control of the variables affecting the operation of the press to be used. Unlike traditional gravure printing, the materials and procedures used to make proofs according to the present invention are identical to those used to make production cylinders.

It is still another object of the invention to provide a procedure for printing with gravure plates or cylinders wherein specifications are set up according to the nature of the material to be printed, the ink to be employed, the character of the substrate and the capabilities of the production press which specifications are based on specific cell geometry and resultant density values and which enable uniform production copies to be made which correspond to the original copy or proof, without the need for reworking of plates or cylinders and without the need for separate cylinders for line copy and process copy, and with a reduction in start-up time and reduction in the waste in printing commonly encountered in gravure printing with the methods heretofore practiced.

A further object of the invention is to provide a gravure printing procedure which can be used for any of a plurality of screen values, any conventional stock material and any common ink formulation and which enables specifications to be devised in terms of cell geometry which can be followed in etching the plates or cylinders so as to obtain duplication of the same.

The foregoing objects and advantages are attained by following the procedure and employing the tools of the present invention wherein an engineered set of standards or specifications is obtained by documenting the cell diameter, volume and geometry of the engraving that produces the most desirable results under production conditions, with the use of a specific ink and paper and on the press to be used. This is accomplished through a production trial run using a cylinder which will act as a constant and which will provide measurable data expressing the variables of ink, substrate and press settings. During the trial run changes in settings and conditions can be made to document or record the effect of variables on the results obtained with the use of the constant cylinder. Analysis of the results of the trial run will then provide the press operator with valid data for press operation and also provide data for use by the engraver to enable a co-ordinated technical effort which is designed to produce optimum production results. The data obtained through the trial run is employed to establish production procedure standards or specifications in terms of density values or cell geometry for the photography and engraving required, ink formulation and also for control of the press so as to obtain optimum quality production. In addition, future changes in either methods or materials to accommodate particular copy can be evaluated relative to the established standards.

A clear understanding of the invention may be had by consideration of the hereinafter described procedures and tools which are employed in carrying out a method of gravure printing which embodies the principles of the invention and the accompanying drawings which illustrate certain procedures of the preferred method.

IN THE DRAWINGS

FIG. 1 is a diagrammatic illustration of the steps involved in the practice of a gravure printing method according to the invention;

FIG. 2 is a diagrammatic view illustrating in graphic form typical successive steps in the photographic and plate etching procedure for obtaining a gravure print which is a reproduction of an original continuous tone copy;

FIG. 3 is an illustration of a photographic film positive displaying a characteristic set of tone scales and adapted for use in producing a test cylinder of known cell geometry for employment in a press production run to determine press characteristics and the effect of printing variables;

FIG. 4 is an illustration of a table containing data on cell geometry and density obtained in a test run of a gravure press with a tone scale engraved test cylinder;

FIG. 5 is an illustration of a typical specification for etching gravure production cylinders according to the invention; and FIG. 6 is an enlarged schematic view of a three tone scale employed in controlling the engraving and production operations.

The objective of the system or procedure which constitutes the present invention is to identify the variables of gravure photographic and printing operations and to set up specifications for controlling the various operations including geometric specifications for the etching of the plates or cylinders for production, the latter being based on calculated cell geometry, that is, the profile and dimensions of the cells as determined by densitometer measurement of photographic film image, which enables the resist, exposure and etching to be controlled so as to obtain accurate image transfer or duplication without hand work on the production plates or cylinders. The system may be characterized as linear gravure production since it follows a sequential manufacturing path converging at the press nip and results in a gravure product made to determined specifications which take into account the variables affecting the operations. A diagrammatic illustration of the sequence of steps in carrying out the method is shown in FIG. 1 of the drawings. In FIG. 2 of the drawings a typical sequence of reproduction is illustrated beginning with the photographing of the original copy (step 1) and running through the image transfer steps and engraving of production cylinders to production printing and checking of printed product against original copy (step 6). It is understood that these steps may not be carried out individually but with the advent of electronically controlled direct screen technology several steps may be combined.

In practicing the present invention the initial step in establishing a set of specifications is the formulation or setting up of a gravure analysis chart, that is, the preparation of a chart which shows the effect of the nip aggregate on the printing of tone scales, dual positive tone scales and half-tone scales, all of which have been etched simultaneously on a test cylinder. A typical chart is shown in FIG. 3 of the drawings. By nip aggregate is meant the press variables which are controllable or predetermined. These include ink formula, doctor blade setting, impression roll setting, substrate, which may be paper, paperboard, film, foil, etc., press speed, dryer temperatures, ambient temperature and humidity, and individual characteristics of the press design.

The press operator is provided with a test cylinder with which the operator is able to run a quantity of sample printed products, under known conditions, which may be recorded, and to measure the tone values of the production samples by reflection densitometry. The test cylinder, which is prepared as hereinafter described, has engraved thereon under controlled conditions employing specially prepared film, a plurality of tone scales of known character (FIG. 3). FIG. 3 shows solid continuous tone bars between the tone scales which are useful in etching the test cylinder by maintaining the chemical strength of the etching fluid across the entire plate. The tone scales may be measured on the film by transmission densitometry and assigned density values while the cell geometry on the cylinder may be measured by microscopy to determine the density values which will result on the printed copy. A reliable instrument for measuring cell geometry is the American Optical Gravure Depth Gauge, available commercially. Each tone scale comprises a series of equally spaced images embodying a range of tone values which vary in equal increments from a predetermined shadow or high value density to a predetermined light or low density value.

With the analysis chart and a dried ink film specification, expressed in terms of densitometer values or measurements of coverage expressed as pounds per unit of area or other convenient unit, the correct specific cell geometry for the engraving, expressed in terms of cell area or wall thickness and depth, and the correct values for the press variables can be assigned prior to the start of production with assurance that the combination of specific cell geometry and nip aggregate will produce the required density or coverage for maximum quality reproduction or printed product over the range of tone values in the material to be printed.

The engraved cylinder which is supplied to the press operator for use in the printing operation which supplies the necessary data for preparation of the analysis chart is etched by first preparing a tone chart comprising a series or plurality of sets of tone values from which photographic screen positives are made to a specification expressed in values measured by transmission densitometry ($D = (1/T) \log 10$). The tone values appear on the chart in the form of image areas of equal size with the areas equally spaced as shown in FIG. 3, each having half tone dots of a known specified planographic shape, such as square dots, for example. A film strip may be prepared by photography to specifications, which, in the tone scale illustrated in FIG. 3, result in a series of image areas, equally spaced, and varying in densitometer reading between 0.50 and 0.02 in known and recorded decreasing increments. With this strip successive tone scales can be provided by holding the lightest area to the same density value while reducing the shadow image by a predetermined, usually equal amount. In the illustrated chart that amount is 0.05, the density variation between the images in the original film strip. The tone values are printed in a single color, preferably, of high contrast, such as red or blue, and the series will be a multiple number, generally, four, five, or more, with each set of tone values varying by known and recorded increments approximately equal, between a densitometric reading of 0.50 for the shadow tone value and 0.02 for the light tone value. The set having the larger number of steps, which has been formed from the initial film strip and which is shown on the left in FIG. 3, will comprise 15 steps and successive sets will comprise tone values in which the shadow tone has a lesser density value by 0.05 while the light tone value remains at 0.02 resulting in a lesser number of steps between the shadow tone value and the light tone value, with the 5th set, in density decreasing order, comprising 11 steps between the shadow tone value of 0.30 and the light tone value of 0.02. It will be understood that whereas the individual image areas need not differ from one another by the same density increment, each successive area should represent a known density and the succession of individual steps should differ sufficiently from each other to provide a range of data from which a useful printed density difference chart can be made. All values are plus or minus 0.01 which is within the limit of measurement accuracy of the densitometer. The production of the tone chart is not limited to any single screen or screen ruling. Films may be prepared with any photographic screen that will produce half tone dot structures regardless of the shape of the dots or the structure of the screen. Generally, 150 line monolinear screens will be used.

The tone scale image may be transferred to a press cylinder for engraving by employing a gravure resist which is relatively stable chemically and which is controllable to provide predetermined cell structure on either a conventional copper proof plate or a conventional production cylinder which, after etching, may be chrome plated for greater wear. A suitable gravure resist film which is presently available commercially is produced by E. I. DuPont DeNemours Co., of Wilmington, Delaware, and marketed under the trademark name "Cronavure." The CRONAVURE diffusion resist is understood to comprise a thin, tough, photosensitive layer coated on a dimensionally stable polyester photographic film support with a backing layer which provides halation protection. This resist is adapted to be exposed and laid up on a copper plate or cylinder surface in the normal manner. It is prepared for etching after exposure and lay up by immediately stripping the support film since neither photographic processing nor hot water washout of unexposed gelatin are needed. In etching, the diffusion rate of the ferric chloride through the uniform thickness of the resist is controlled entirely by the degree to which the sensitized layer has been hardened during exposure. Exposure is in the usual manner after draw down in the vacuum frame. Instructions for handling this resist during exposure and wet lay down are available from the manufacturer. The usual etching techniques may be employed. The variables which affect the etching are Baume, time, temperature and the age of the iron used. These variables may be controlled so as to enable the resist to be used with predictable results. This enables one set of film to be employed to produce gravure proof plates and production plates or cylinders which conform without the need for any correction or any hand work on the same, and duplication of production plates or cylinders can be had. Any alterations desired can, of course, be taken care of by altering the film prior to the image transfer and etching operations.

It will be understood that, according to the usual practice of the present invention, the film from which the test cylinder is made and the test cylinder itself are different from each other. First, in the film itself, a plurality of rows of tone images are provided. Each row, such as row A, row B, etc. contains a plurality of image areas. In the basic film, the density of image area A3, for example, is the same as the density of image area B3, C3, etc. Row B differs from row A only in that the last tone image area in row A has no counterpart in row B, the last two tone image areas in row A lack counterparts in row C, etc., all as shown in FIG. 3.

However, a typical test cylinder made from this film will have its cells in adjacent rows differing from each other in both area and depth. Accordingly, in the film, image areas B4 and C4 will be of the same density, but in the test cylinder, image area C4 will be comprised of cells which are deeper and therefore have greater volume. Accordingly, a printed specimen made using the test cylinder will show area C4 to be darker than area B4, simply because image area C4 on the test cylinder can retain a greater volume of ink.

In creating the deeper etching, or different cell depth, which characterizes the different rows in the test cylinder, various methods may be used. However, one preferred method is first to expose the resist used in cylinder making to light directed through film containing the half tone specimens just referred to, that is, film containing the various rows of image areas. After the resist has thus been exposed, a second exposure is made, this time through the same half tone film, to which has now been added a plurality of rows of continuous tone film, of differing densities, each overlying a particular row of tone image areas.

Accordingly, because the portions of the film overlain by the various continuous tone films admit different amounts of light to the counterpart rows in the resist, the resist is characterized by rows having different effective exposures, and a test cylinder will be produced having different cell depths as among the various rows of image areas.

The effect of the first exposure is to establish the plane geometry of the tone image areas, while the effect of the second exposure is to control the depth of etching. Thus, the depth of etch in a given row will differ from the depth of etch in an adjacent row by a gradient which is proportional to the difference in densities in the continuous tone films which covered each of the respective tone image areas in the film.

The tone cylinder, when etched, comprises distinct image areas varying both in area and depth, and hence volume, by known values. Making the test cylinder to known and recorded geometric specifications creates a cylinder which can thus be duplicated on demand by following known procedures. Such a standard cylinder eliminates consideration of the cylinder as a variable in the printing process and enables an analysis chart to be prepared from which maximum reproduction values can be determined, that is, the press operating conditions which will result in maximum reproduction quality can be determined for the particular copy, ink and substrate. In addition, the press variables may be changed during the test runs to show the effect of adjustment of the variables on the printed product. The press operating test runs can also be employed to determine the tone scale which will best serve to control the production of proof plate and production cylinder configuration for the particular press and the particular substrate and ink which has been determined upon as best for reproduction of the particular copy which it is desired to reproduce. The image areas of the film tone scales may be measured by transmission densitometry and recorded on the analysis chart. The printed image areas on the printed samples obtained during the test run or runs may be measured by reflection densitometry and recorded. These values may be plotted on a graph for each set of the tone scale values so as to determine which set of tone scale values will result most nearly in theoretical maximum quality or optimum tone reproduction. The density values for each tone scale on the printed samples are plotted on the graph against the density values for the same tone scale on the film used for the test cylinder to obtain a Curve of Reproduction, that is, a generally linear curve of printed tone values plotted against tone values of original copy. From these graphs it can be determined which set of these values has the closest correspondence throughout a predetermined range of the tone values. This enables the selection of the three tone scale which is to be used for control purposes and which is expressed in terms of densitometric values. It will most nearly result in a straight line of a characteristic slope on the graph when the three values, that is, the shadow tone value, the mid tone value and the light tone value on the printed product are connected. The shadow tone value is the maximum shadow or highest density reading that can be achieved for the nip aggregate of independent and dependent variables of the press. The middle tone value is the one area of specific cell geometry for which the variables of ink formula and doctor blade are most critical, that is, the last tone step where the dots should not touch. The light tone value or lowest density step is the minimum high light value where at least 80 to 90 per cent of the dots are printing, as revealed by close visual inspection, where printing is without dot skipping, not using electrosist. The specific cell geometry of this tone step reveals quality in terms of visual attractiveness of the printing.

In operating the press for the test run or runs with the test cylinder, it is necessary, in order to have a successful run, to follow basic procedure, which means that the ink should be furnished at maximum pigment concentration if possible. Otherwise, pigment concentration would be determined and recorded for matching purposes. Preferably, a single pigment red or blue ink should be used. The grade and source of paper or substrate being printed should be determined and recorded. In addition, a record should be made of conditions and changes which can affect the quality of the printed product such as, ink viscosity, amount of any solvent or extender added to the ink, impression roll durometer and pressure setting, doctor blade thickness, lip and angle, dryer temperature and press speed. Changes in conditions and settings can be made and documented along with the effects on the printing. The data thus obtained will provide a guide for matching or correcting improper settings and conditions when production runs are made so that non-uniformity in the printed product will not occur as the result of a change in press variables or operating conditions.

Having determined the tone scale which will give optimum reproduction for the particular press when using the selected substrate and ink, specifications can be prepared in terms of cell geometry for the particular copy which is to be printed. The cell geometry of the tone scale has been previously determined by measurement of the cell structure of the corresponding tone images on the engraved test cylinder which has been used on the trial run of the press. In FIG. 5 of the drawings there is illustrated a typical specification using a 150 line screen, a shadow tone film density of 0.40 (densitometer reading), a middle tone density of 0.12 and a light tone density of 0.05. The etched dimensions of the three tone values on the test cylinder provide the etch diameter and depth values from which the etch area and the unit volume for each of these values can be calculated, the etch area being the etched plane geometry area diameter in square microns multiplied by the etched depth. The unit volume is understood to mean the aggregate volume of all cells per unit area or one square inch, expressed in cubic microns per square inch, that is, the etch area in square microns multiplied by the screen value squared, which gives the unit volume in cubic microns per square inch. Each etched cell will have a planographic profile and a three dimensional depth profile. The specific cell geometry will reflect the interaction of the photographic image, resist, exposure and etching conditions. Specific cell geometry can be predicted by measuring the film density and controlling the resist, exposure and etching conditions. The three tone images of the tone scale, that is, shadow, middle and light tone images, which are represented in FIG. 6 of the drawing, will be engraved on the production cylinders and provide a check point for monitoring the production.

The etching of the cylinders for production runs on the press is governed by the specifications defining the cell geometry for producing the tone values or range of tone values according to the tone scale which the results of the test run or runs has shown will produce optimum reproduction on the press to be used. The copy to be reproduced may be given to the cylinder maker with the cell geometry specifications to be met. The cylinder maker is able to select image areas on the copy by densitromic measurement corresponding to the shadow, middle and light tones and by controlling the photography or the image transfer and etching through the use of a resist which may be controlled to give predictable results, such as, CRONAVURE, etch the cylinder by known methods and produce cell geometry which will meet the specifications without requiring any hand work on the etched cylinder or plate. Duplicate cylinders or plates may be prepared using the original copy or film material and working to the same specifications.

The system or method is applicable to multi-color gravure printing. Only one test cylinder is required for determining optimum reproduction on the particular press, the range of tone values for optimum reproduction being the same for color or black and white. Where "trapping," or the overprinting of one ink on another occurs, and creates a problem, provision can be made by known means for eliminating this variable. The usual photographic procedures may be followed and the three tone control may be employed to enable linear production of the cylinders following the reproduction pattern illustrated diagrammatically in FIG. 2 of the drawings.

While various steps or procedures are illustrated in the drawings, it will be understood that the schematic views are illustrative and the values in the separate views do not represent a single example or a particular production job. Because of the small areas and distances involved and the limitations of the measuring instruments employed, measurements cannot be made, in practice, which are fully accurate.

I claim:

1. A method of gravure printing which comprises providing a gravure press with a test cylinder having engraved thereon a tone scale chart comprising a plurality of tone scales each characterized by a plurality of spaced image areas ranging from a deep shadow tone to a light shadow tone with the deep shadow tones differing by a known density increment and the density of the tone image areas in each scale varying by a predetermined density value, the cell geometry of the tone image areas on the tone test cylinder being measured and recorded, operating said press with the test cylinder and a selected substrate and an ink formulation selected according to copy to be reproduced, varying the press operating conditions to obtain the best printed samples of commercially acceptable quality, measuring and recording the density values of the tone image areas on the printed samples obtained and plotting the density values thereof against the density values of the tone chart to determine the tone scale which has points of closest correspondence throughout a range of density values of the corresponding tone scale on the tone scale chart and which will result in optimum reproduction by said press, and setting up a specification in terms of cell geometry, derived from the cell geometry of the corresponding tone scale on the test cylinder, for the deepest shadow, middle and light tone values as measured on the copy, which specifications are to be met in the production of photographic film, image transfer and etching of production cylinders so as to obtain optimum reproduction of the copy on said press.

2. A method of gravure printing as set forth in claim 1 wherein the steps of varying the press operating conditions includes operating the press with different adjustments of the doctor blade, roll pressure, and ink formula and recording the effect of these variables on the printed product so as to provide guidance for correcting press settings during production.

3. A method of gravure printing as set forth in claim 1 wherein setting up said specification includes measuring the maximum and minimum density image areas on the copy to be reproduced, selecting the corresponding density values on the printed tone scale which will result in optimum reproduction by said press, and determining the cell geometry of the corresponding image areas on the test cylinder which produce these image areas on the test samples.

4. A method of gravure printing which comprises preparing a test cylinder having engraved thereon a tone scale chart, which chart comprises a plurality of tone scales each characterized by a plurality of spaced image areas of predetermined density ranging from a deep shadow tone to a light shadow tone with the deep shadow tones differing by a predetermined density increment and the density of successive tone images in each scale varying by a predetermined equal amount, measuring and recording the cell geometry of the tone images on the tone test cylinder, operating the press with the test cylinder and a substrate and ink formulation which has been selected according to copy to be reproduced, adjusting the variable press operating conditions during the test run and visually selecting the best production samples of commercially acceptable quality, measuring and recording the density values of the tone images on the selected production samples and plotting the density values against the density values of the tone chart and determining the tone scale on the tone scale chart which will result in optimum reproduction by the press, preparing a specification, in terms of cell geometry, for the deepest shadow, middle and lighest tone values on the copy which is to be reproduced which specification is to be met in the production of photographic film, image transfer and etching of production cylinders, and operating the press for production with the selected substrate and ink and with cylinders prepared according to said specification under the press conditions as determined from the test run, which will obtain optimum quality reproduction of the copy.

5. A method of gravure printing as set forth in claim 4 wherein the step of preparing a test cylinder includes preparing a film for producing the tone scale chart which has equally spaced image areas each differing from the adjacent areas by a predetermined known density value and varying in substantially equal steps from a predetermined shadow tone density to a predetermined light tone density for use in transferring the chart image areas to a resist and etching the cylinder.

6. A method of gravure printing as set forth in claim 4 wherein the step of preparing a test cylinder includes preparing a film for producing the tone scale chart which film has equally spaced image areas each differing from the adjacent areas by a known density value and varying in steps which provide a range of density between a predetermined deep shadow tone density and a predetermined light tone density, transferring the film image areas to a resist in a series of exposure steps so as to provide a plurality of tone scales having image areas with a different density range.

7. A method of gravure printing as set forth in claim 6 wherein the step of transferring the film image areas to a resist includes successive exposures for transferring each tone scale with the second exposure being with a continuous tone film of known density which differs for each tone scale.

8. A method of gravure printing as set forth in claim 6 wherein the step of preparing a test cylinder includes preparing a photographic film positive which has equally spaced image areas of equal size and each differing from adjoining areas by a substantially equal density increment so as to provide a range of density values between a deep shadow tone density value and a light tone density value, transferring the film image areas to a resist with the shadow density progressively a different density value so as to provide a series of side by side tone scales each having a different range of density values.

9. A method of gravure printing which comprises preparing a test cylinder having etched thereon a test tone chart which includes a plurality of tone scales in the form of image areas which differ in density over a wide range with the density of each area being predetermined, the etched image areas on the cylinder each having a cell geometry capable of reproducing, when printing, the corresponding image area on the tone chart which has been employed in etching the cylinder, operating the production press with the test cylinder and preselected substrate and ink formula, adjusting the press variables, if required, to provide printed samples which appear to afford the best quality reproduction of the image areas on the tone chart, plotting the density values of the image areas on the printed samples against the density values of the corresponding image areas on the tone chart to determine the tone scale affording optimum reproduction by the press, measuring the density of the maximum shadow tone area and the lightest tone area on the copy to be reproduced so as to determine the range of tone values desired to be reproduced, formulating a specification, in terms of cell geometry, for etching shadow tone, medium tone and light tone image areas on production cylinders based on the cell geometry of the tone image areas on the test cylinder which produced the tone image areas on the printed tone scale found to afford optimum reproduction and which most nearly correspond to the tone image areas for the desired tone values as measured on the copy, producing production cylinders according to the specifications and printing with these cylinders on the press under the press operating conditions which produced the selected samples on the test run and with said preselected substrate and ink formula.

10. A method of gravure printing as set forth in claim 9 wherein the step of preparing a test cylinder includes preparing a film positive having thereon a plurality of equally spaced image areas ranging in density between predetermined maximum shadow tone density and predetermined light tone density in known density increments, transferring the film images to a resist in successive steps with the shadow tone density differing by one density step for each successive tone scale so as to provide a plurality of tone scales each having a known density gradient.

11. A method of gravure printing as set forth in claim 10 wherein the step of preparing the test cylinder includes preparing a continuous tone film of known density for transferring to the resist by a second exposure on each of the successive tone scale areas with each continuous tone film having a different density.

* * * * *